(12) United States Patent
Stojanovic (10) Patent No.: US 11,018,768 B2
(45) Date of Patent: May 25, 2021

(54) TRANSMISSION SYSTEMS WITH CONTROLLED BIT PROBABILITIES

(71) Applicant: Huawei Technologies Co., Ltd., Shenzhen (CN)

(72) Inventor: Nebojsa Stojanovic, Munich (DE)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 16/706,007

(22) Filed: Dec. 6, 2019

(65) Prior Publication Data

US 2020/0112371 A1 Apr. 9, 2020

Related U.S. Application Data

(63) Continuation of application No. PCT/EP2017/063758, filed on Jun. 7, 2017.

(51) Int. Cl.
*H04B 10/25* (2013.01)
*H04B 10/2513* (2013.01)
*H04B 10/556* (2013.01)
*H04L 1/00* (2006.01)

(52) U.S. Cl.
CPC ... *H04B 10/25133* (2013.01); *H04B 10/5561* (2013.01); *H04L 1/0043* (2013.01)

(58) Field of Classification Search
CPC .......... H04B 10/5561; H04B 10/25133; H04L 1/0043
See application file for complete search history.

(56) References Cited

U.S. PATENT DOCUMENTS

| 5,144,304 A | 9/1992 | McMahon et al. |
| 5,606,317 A | 2/1997 | Cloonan et al. |
| 5,784,409 A * | 7/1998 | Coles .................. H04L 25/4925 341/56 |

(Continued)

FOREIGN PATENT DOCUMENTS

| CN | 1656692 A | 8/2005 |
| CN | 101662339 A | 3/2010 |

(Continued)

OTHER PUBLICATIONS

Ramabadran, T., "A Coding Scheme for M-out-of-N Codes," XP000162507, IEEE Transactions on Communications, New York, USA, vol. 38, No. 8, Aug. 1, 1990, p. 1156-1163.

(Continued)

*Primary Examiner* — Dzung D Tran
(74) *Attorney, Agent, or Firm* — Conley Rose, P.C.

(57) ABSTRACT

A binary encoder includes an input configured to receive a binary signal, an encoding processor configured to compute a plurality of different variations of the binary signal, combine each of the different variations with a different redundancy sequence to create a plurality of optional output binary sequences, and select one of the optional output binary sequences according to a binary digit prevalence, and an output configured to output the selected binary sequence. A decoder configured to identify a redundancy sequence of a received binary signal to select a transformation function according to the redundancy sequence and to convert the binary signal according to the transformation function.

20 Claims, 11 Drawing Sheets

(56) References Cited

U.S. PATENT DOCUMENTS

| | | | |
|---|---|---|---|
| 2003/0188248 A1 | 10/2003 | Kauschke et al. | |
| 2010/0013683 A1* | 1/2010 | Boehl | H04L 25/4915 341/94 |
| 2010/0080312 A1* | 4/2010 | Moffatt | H04L 27/2618 375/260 |
| 2010/0231425 A1* | 9/2010 | Chaichanavong | H03M 5/145 341/58 |
| 2011/0025532 A1* | 2/2011 | Markram | H04L 25/493 341/61 |
| 2013/0238952 A1* | 9/2013 | Varanasi | H03M 13/255 714/755 |
| 2015/0160991 A1 | 6/2015 | Stojanovic et al. | |

FOREIGN PATENT DOCUMENTS

| | | |
|---|---|---|
| CN | 103000123 A | 3/2013 |
| CN | 104205647 A | 12/2014 |
| EP | 0588307 A2 | 3/1994 |

OTHER PUBLICATIONS

Foreign Communication From a Counterpart Application, PCT Application No. PCT/EP2017/063758, International Search Report dated Feb. 22, 2018, 7 pages.
Foreign Communication From a Counterpart Application, PCT Application No. PCT/EP2017/063758, Written Opinion dated Feb. 22, 2018, 8 pages.

\* cited by examiner

TRANSMISSION SYSTEMS WITH CONTROLLED BIT PROBABILITIES

CROSS-REFERENCE TO RELATED APPLICATIONS

This application is a continuation of International Patent Application No. PCT/EP2017/063758 filed on Jun. 7, 2017, which is hereby incorporated by reference in its entirety.

BACKGROUND

The present application relates to noise reduction and, in particular, to noise reduction based on bit probability control for adjusting a signal.

Advances in optical and electrical components design allow increasing capacity of optical links. Using complex modulation formats, both principal states of polarization, and coherent detection, it is possible to transmit 100 gigabits per second (G, Gb/s) data over more than 2000 kilometers (km) in commercial applications. Comparing to traditional non-coherent 10 Gb/s transmission, this results in 10 times traffic increase. Of course, this advantage does not come for free. Coherent systems use much more expensive devices and advanced signal processing that also increases power consumption. Later, when component production became more mature the price of 100 G coherent transponders also fell so that using 100 G transponder is more profitable than deploying the 10 G transponders (price, size, cost, and the like).

Carriers are looking to adapt cheaper high capacity solutions which may be based on cheaper components and not power hungry digital signal processing (DSP). High level of integration, cheaper components, and sophisticated DSP attracted significant interest. Intensity modulation and direct detection (DD) systems seem to be the most promising candidates as their transmitter and receiver cost is much less compared with the price of coherent systems. Modern coherent systems use high bandwidth components and can efficiently compensate for chromatic dispersion (CD) and polarization mode dispersion (PMD). Unlike coherent systems, non-coherent systems can be used in very limited applications when wavelengths carrying information are selected from the third window (wavelengths around 1550 nanometer (nm)) and using dispersion compensating fibers (DCF) (these fibers have opposite dispersion than fiber dispersion) is not desirable. However, many existing optical links contain DCFs that again offers opportunities for realizing cheaper transmission systems based on the DD. Additionally, in asymmetric systems the transmitter can use in-phase and quadrature (IQ) modulator to compensate for CD and cheap DD receivers can successfully cope with the residual CD and other imperfections.

The state of the art 10 Gb/s optical transponder uses very cheap distributed feedback laser (DFB) together with electro-absorption modulator (EAM) integrated in transmit optical subassemblies (TOSA). The power of optical signal is almost proportional to the electrical signal modulating the laser. At the receiver side, a photo diode (such as positive-intrinsic negative (PIN) or avalanche photo diode (APD)) detects the optical signal. Output of the photo diode is proportional to the power of optical signal. The photo diode output is amplified using transimpedance amplifier (TIA). The photo diode and the TIA can be integrated into receive optical subassemblies (ROSA) that may include an automatic gain control circuit (AGC) to adjust electrical signal to an analog-to-digital converter (ADC) input when electronic equalization is used.

Figure 1:
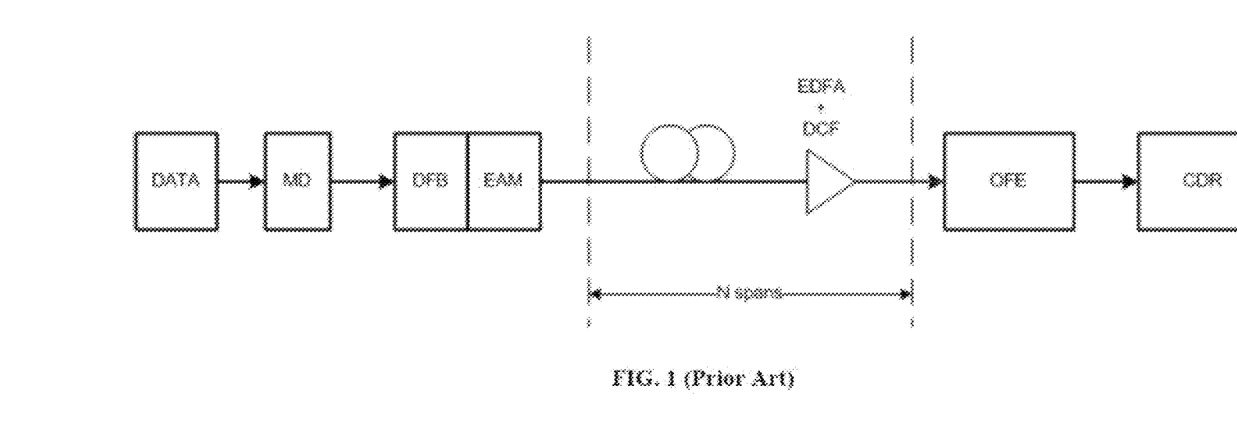
FIG. 1 is a block chart of a typical transmitter for 10 Gb/s transmission scenario.

A typical 10 Gb/s transmission scenario is presented in FIG. 1. Data are amplified using a modulator driver (MD). DFB and EAM are responsible for modulation. Optical signal is transmitted over several spans consisting of fiber, erbium-doped fiber amplifier (EDFA) or other types of optical amplifiers and DCFs. An optical front end (OFE) includes a photo detector and amplifier, usually integrated in ROSA. Signal suffering from residual CD, PMD, and narrow electrical bandwidth is equalized using finite impulse response (FIR), decision feedback equalizer (DFE), maximum likelihood sequence estimator (MLSE), or combination thereof in a clock and data recovery block (CDR).

Figure 2:
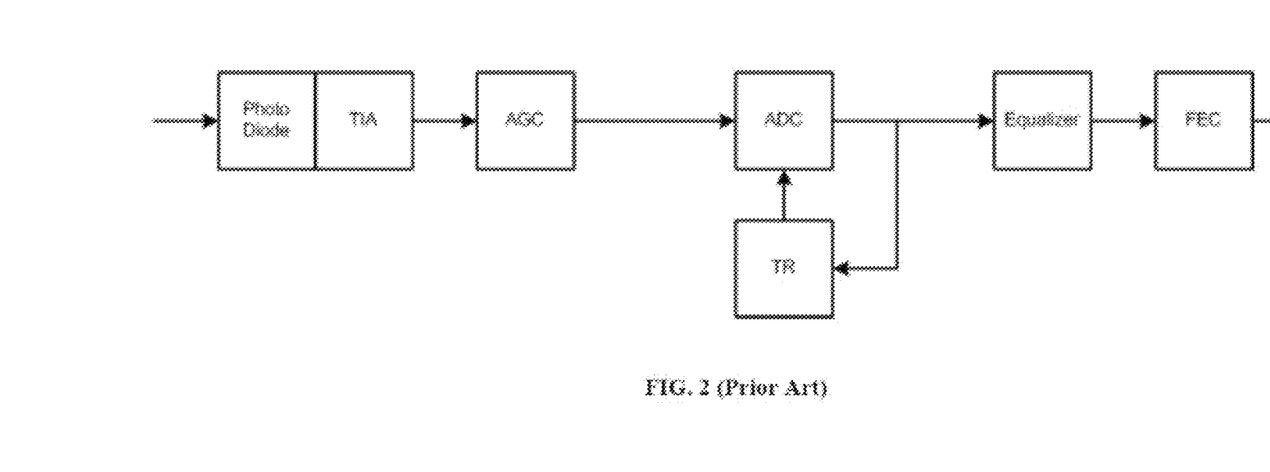
FIG. 2 is a typical receiver side.

A typical receiver side is shown in FIG. 2. AGC block monitors signal power variations and produce almost constant signal swing that fits into ADC input range. This way, the ADC is effectively used. With signals suffering from CD, it is very important that the signal is not clipped. Also, the signal should not be too small so that only a few ADC levels are active. Equalizer recovers signal suffering from noise and intersymbol interference (ISI). However, before the equalizer is activated the local oscillator must be locked to the input signal, i.e. to the transmitter oscillator responsible for data clocking. These two oscillators must be synchronized. Small deviations are allowed since it is impossible to perfectly track the transmitter clock source. Clock extraction is supported by a phase detector (PD) that outputs information whether sampling clock frequency/phase is higher or lower than that of the transmitter oscillator. A forward error correction (FEC) blocks corrects residual errors after the equalizer.

SUMMARY

It is an object of the present application to provide an apparatus, a method, a computer program product, and a system for binary encoding and decoding. The foregoing and other objects are achieved by the features of the independent claims. Further implementation forms are apparent from the dependent claims, the description and the figures.

According to a first aspect there is a binary encoder (BE) comprising an input adapted to receive a binary signal, an encoding processor adapted to compute a plurality of different variations of the binary signal, combine each one of the plurality of different variations with a different redundancy sequence to create a plurality of optional output binary sequences, and select one of the plurality of binary sequences according to a binary digit prevalence and an output adapted to output the selected binary sequence.

According to a second aspect there is a method of binary encoding that includes receiving a binary signal, computing a plurality of different variations of the binary signal, combining each one of the plurality of different variations with a different redundancy sequence to create a plurality of optional output binary sequences, selecting one of the plurality of binary sequences according to a binary digit prevalence, and outputting the selected binary sequence.

The apparatus, systems, methods, and/or code instructions described herein allow improving bit error rate (BER) by controlling the binary digit prevalence of 1 bit. The apparatus, systems, methods, and/or code instructions described herein allow reducing error rates as more errors occur in sequences with more binary digit transitions.

In a further implementation form of the first and second aspects, the encoding processor is adapted to select one of the binary sequences according to a number of digit transitions therein. This allows reducing error rates as more errors occur in sequences with more binary digit transitions.

In a further implementation form of the first and second aspects, the encoding processor is adapted to combine each one of the plurality of different variations using a modulo 2 operation. This allows simple single action computation of the combination.

In a further implementation form of the first and second aspects, the plurality of different variations are calculated using a plurality of different binary transformation functions, for instance based on a Hadamard matrix.

In a further implementation form of the first and second aspects, the different redundancy sequence is selected from a plurality of different redundancy sequences defined in a lookup table (LUT). This allows simple calculation of redundancy sequences and simple sharing of the redundancy sequences with the decoder for decoding purposes.

In a further implementation form of the first and second aspects, the binary digit prevalence is calculated according to at least one count of a selected digit in each of the plurality of different variations.

In a further implementation form of the first and second aspects, the encoding processor is adapted to average at least one count of a selected digit in each of the plurality of different variations by a low-pass filter and to select one of the plurality of binary sequences as a binary sequence having the highest averaged count or the lowest averaged count.

In a further implementation form of the first and second aspects, the selected binary sequence is transmitted using a dispersion compensation module (DCM) for CD pre-compensation.

In a further implementation form of the first and second aspects, the selected binary sequence is transmitted via a dispersion compensation fiber (DCF).

In a further implementation form of the first and second aspects, the selected binary sequence is transmitted using an IQ or dual-drive Mach-Zehnder modulator (MZM) for CD pre-compensation.

According to a third aspect there is a binary decoder (BD) that comprises an input adapted to receive a binary signal, a decoding processor adapted to compute an origin binary signal by identifying a redundancy sequence in the binary signal, selecting a transformation function according to the redundancy sequence, converting the binary signal according to the selected transformation function, and removing the redundancy sequence from the binary signal, and an output adapted to output the origin binary signal.

According to a fourth aspect there is a method of decoding a binary signal that comprises receiving a binary signal and computing an origin binary signal by identifying a redundancy sequence in the binary signal, selecting a transformation function according to the redundancy sequence, converting the binary signal according to the selected transformation function, and removing the redundancy sequence from the binary signal. This allows outputting the origin binary signal.

In a further implementation form of the third and fourth aspects, the decoding is based on decoding a binary signal encoded using the BE of the first aspect or using the method of the second aspect and/or any of the above described implementation forms.

Unless otherwise defined, all technical and/or scientific terms used herein have the same meaning as commonly understood by one of ordinary skill in the art to which the application pertains. Although methods and materials similar or equivalent to those described herein can be used in the practice or testing of embodiments of the disclosure, exemplary methods and/or materials are described below. In case of conflict, the patent specification, including definitions, will control. In addition, the materials, methods, and examples are illustrative only and are not intended to be necessarily limiting.

BRIEF DESCRIPTION OF THE DRAWINGS

Some embodiments of the disclosure are herein described, by way of example only, with reference to the accompanying drawings. With specific reference now to the drawings in detail, it is stressed that the particulars shown are by way of example and for purposes of illustrative discussion of embodiments of the disclosure. In this regard, the description taken with the drawings makes apparent to those skilled in the art how embodiments of the disclosure may be practiced.

DETAILED DESCRIPTION

The present disclosure, in some embodiments thereof, relates to noise reduction and, further, but not exclusively, to noise reduction based on bit probability control for adjusting a signal.

According to some embodiments of the present disclosure there is provided a binary encoding process wherein a binary signal is converted to a plurality of variations, each added (optionally ended) with a different redundancy sequence. In the binary encoding process one of variations is selected for transmission, for instance the variation having lowest prevalence of a certain binary digit (e.g. lowest count of 1 bits) and/or the variation with the lowest prevalence of binary digit transitions, e.g. lowest numbers of binary digits (e.g. 0 bits), which are neighboring different binary digits (e.g. 1 bits). Optionally, when a number of variations have the same binary digit prevalence, the number of binary digit transitions is taken into account or vice versa. Such a binary encoding assists improving optical system performance by controlling binary value prevalence and/or by reducing error rates as more errors occur in sequences with more transitions. It should be noted that balanced codes do not improve optical system performance, however, when the prevalence of 0 bits is higher than the prevalence of 1 the BER is improved.

Optionally, low pass filter is used controlling probability by averaging the prevalence of binary digits.

Before explaining at least one embodiment of the disclosure in detail, it is to be understood that the disclosure is not necessarily limited in its application to the details of construction and the arrangement of the components and/or methods set forth in the following description and/or illustrated in the drawings and/or the Examples. The disclosure is capable of other embodiments or of being practiced or carried out in various ways.

The present application may be a system, a method, and/or a computer program product. The computer program product may include a computer readable storage medium (or media) having computer readable program instructions thereon for causing a processor to carry out aspects of the present application.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing.

Computer readable program instructions described herein can be downloaded to respective computing/processing devices from a computer readable storage medium or to an external computer or external storage device via a network, for example, the Internet, a local area network (LAN), a wide area network (WAN) and/or a wireless network.

The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a LAN or a WAN, or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present application.

Aspects of the present application are described herein with reference to flowchart illustrations and/or block diagrams of methods, apparatus (systems), and computer program products according to embodiments of the disclosure. It will be understood that each block of the flowchart illustrations and/or block diagrams, and combinations of blocks in the flowchart illustrations and/or block diagrams, can be implemented by computer readable program instructions.

The flowchart and block diagrams in the figures illustrate the architecture, functionality, and operation of possible implementations of systems, methods, and computer program products according to various embodiments of the present disclosure. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Binary signal probabilities can be controlled using designed codes. Such codes are described in T. V. Ramabadran, "A coding scheme for m-out-of-n codes," IEEE Transactions on Communications, vol. 38, no. 8, pp. 1156-1163, August 1990. These codes are block codes with fixed input and output lengths. Blocks of k bits are encoded by blocks of n bits and the probability of 1 is constant (m/n). It means that in n bits there are always m ones. The number of input binary sequences that may be encoded by this scheme, also referred to as codes or codewords, is:

$$N = \binom{n}{m} = c(n, m),$$

where a maximum number of input bits in the input binary word is:

$$k = \left\lfloor \log 2 \binom{n}{m} \right\rfloor.$$

When using the above described designed codes redundancy that becomes critical when large imbalance is introduced. A minimum redundancy may be achieved for m=n/2(p(1)=p(0)=0.5) with balanced codes. Additionally, encoding and decoding latency becomes critical for large n that is necessary for decreasing redundancy.

Figure 3:
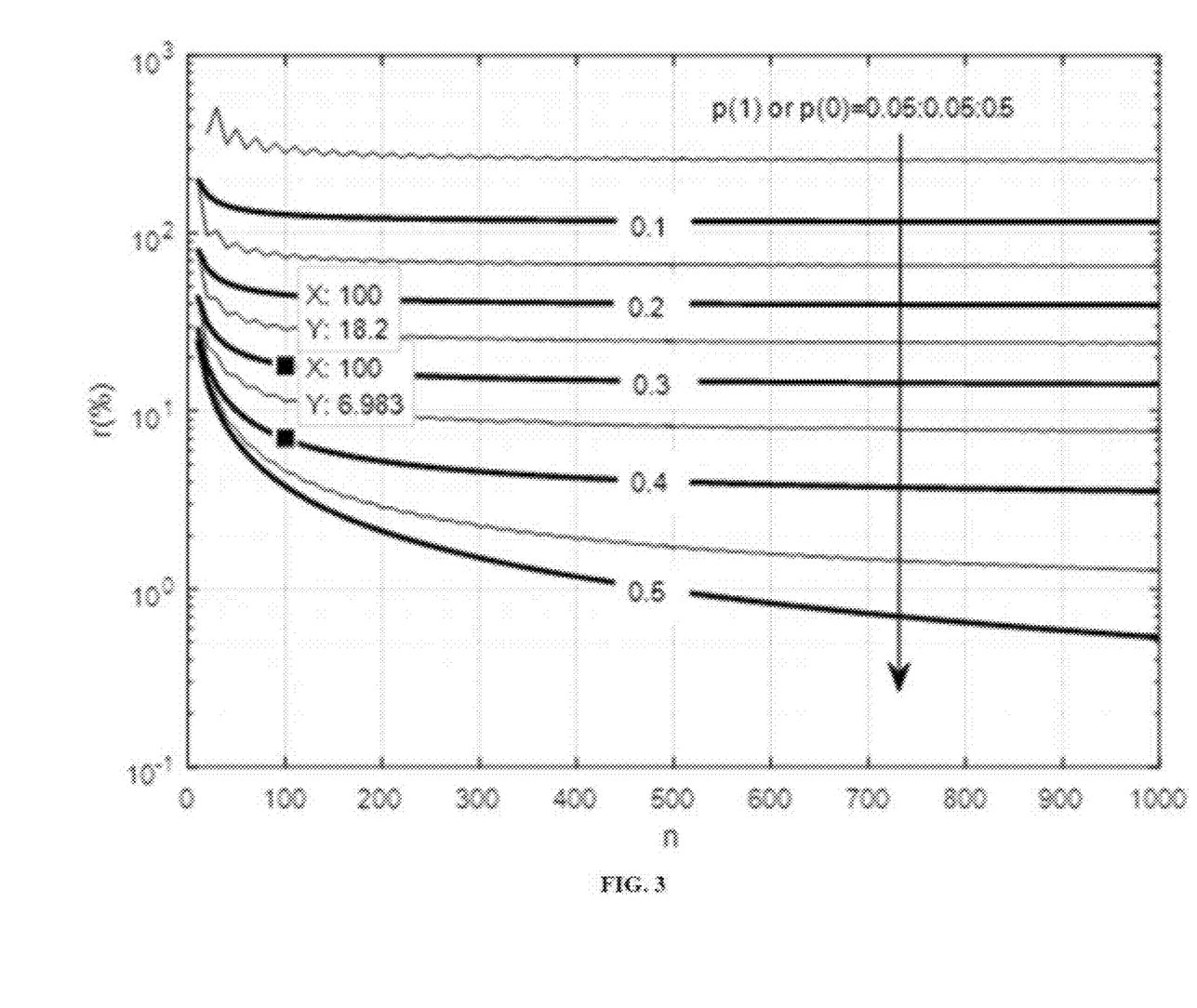
FIG. 3 is a graph depicting a correlation between the required redundancy of m of n codes to achieve a target probability of 1 (or 0)
Figure 4:
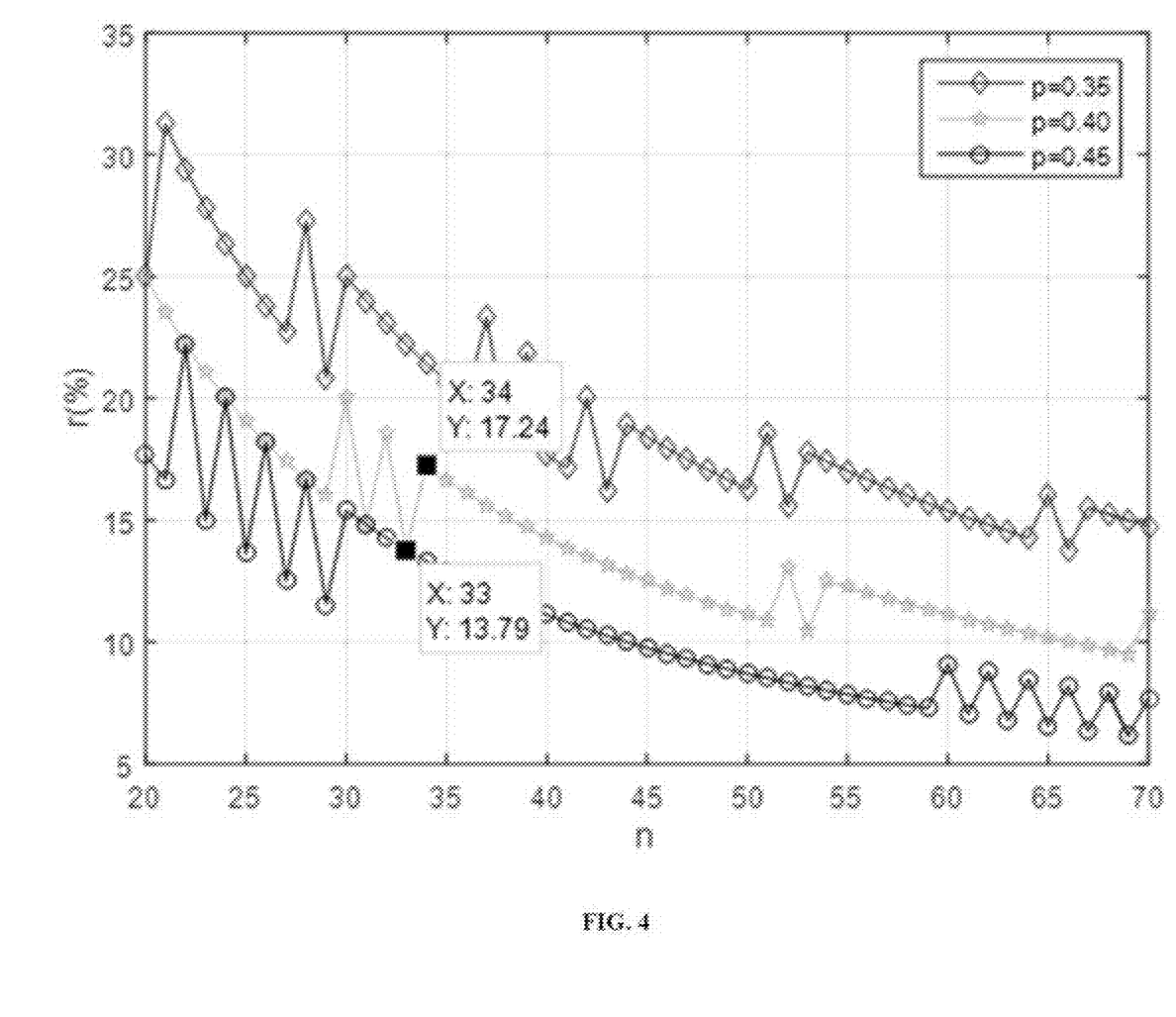
FIG. 4 is a graph depicting a correlation between redundancies of m of n codes to acquire a certain probability for small n values.

Balanced codes do not improve optical system performance; however, when p(0)>p(1) BER may be improved. For example p(1)=0.3 requires ~14% redundancy (for large n), n=100 requires redundancy r=~18%, and p(1)=0.4 requires ~7% redundancy for n=100. As encoding and decoding introduce large complexity for large n since it increases encoding and decoding latency, short m out of n codes are preferable. For example, with n=34 we get m1=log 2(c(34,13))=29.78, p1=0.38,=>m1=29 and r1=17,24% and m2=log 2(c(34,14))=30,37, p2=0.42,=>m2=30 and r2=13, 33%. See also FIG. 3 which is a graph depicting a correlation between the required redundancy of m out of n codes to achieve a target probability of 1 (or 0) and FIG. 4 which is depicting a correlation between redundancy of m out of n codes to acquire a certain probability for small n values.

Assuring that a binary value prevalence probability, for instance the probability of 1 is not fixed in an encoded data block improves system performance and optionally maintained to be proximate to a designed value. An achievable probability will depend on the number of redundant bits, as indicated above, induces potential penalties as the symbol rate is increased. An optimum number of redundant bits depends on transmission system conditions such as linear and nonlinear impairments caused by transmitter components, optical link, and/or receiver components. Electrical and optical noise also determinate BER.

Reference is now made to a description of a process and a BE for improving system performance by controlling binary value prevalence probabilities. In particular, reference is made to FIG. 5 which is a schematic illustration of a process 100 encoding a binary signal at a transmission side by computing different variations of the binary signal and combining them with different redundancy sequences to create optional output binary sequences which are selected according to binary digit prevalence, according to some embodiments of the present application. Reference is also made to a FIG. 6 which is a block chart of a BE (designated as binary encoder 200) which is adapted to be used for encoding according to the process depicted in FIG. 5, according to some embodiments of the present application.

Figure 6:
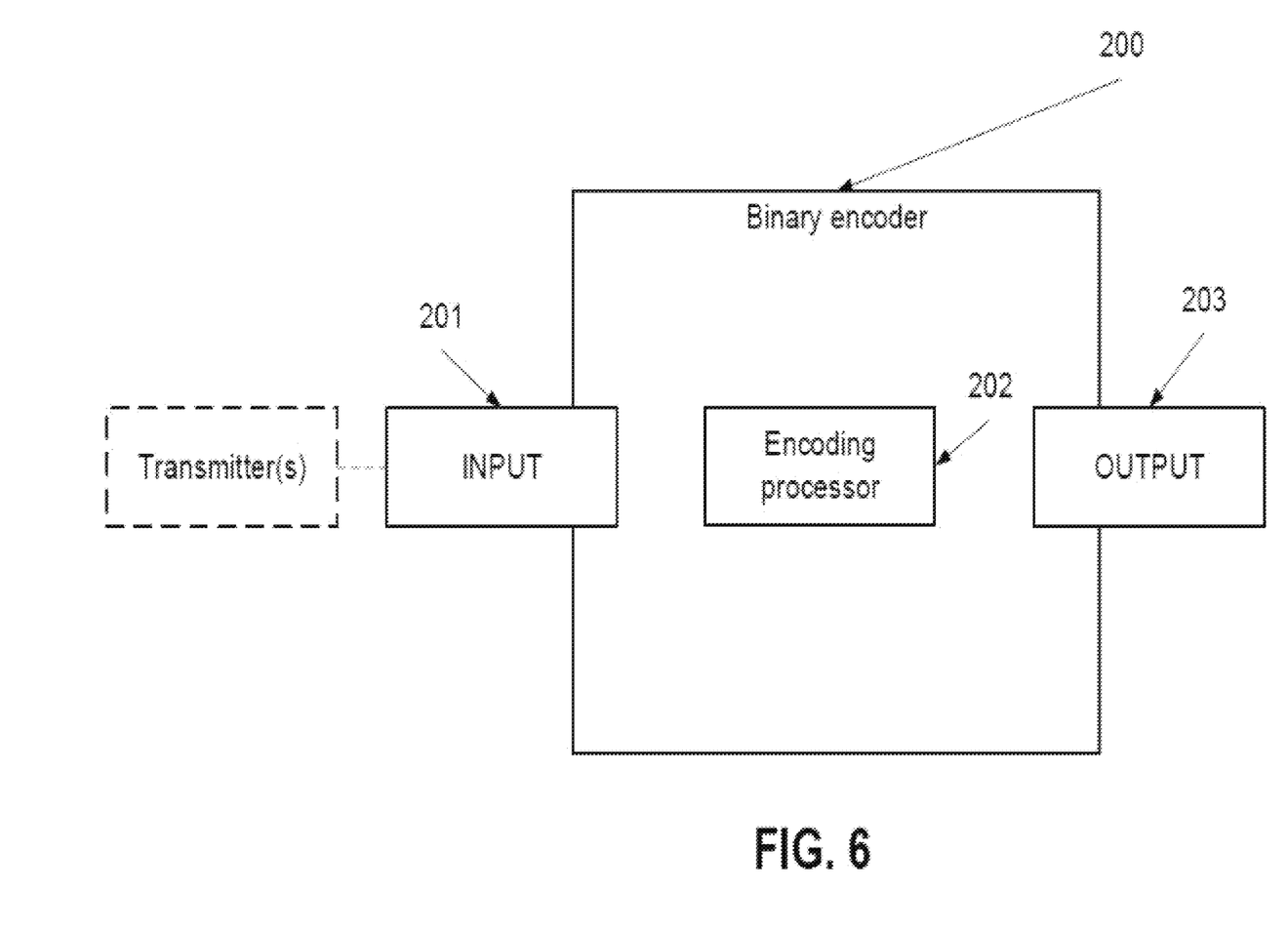
FIG. 6 is a block chart of a BE adapted to be used for encoding according to the process depicted in FIG. 5 according to some embodiments of the present application.

The BE 200 includes an input 201 such as a signal after framer for receiving a signal and an encoding processor 202. An output 203 is connected to a transmitter for transmitting the encoded sequence, optionally via an optical fiber and/or a DCF.

In the following description x denotes a binary signal which is optionally an input bit sequence having a length L, R denotes a number of redundant bits and the length of the output bit word is N=L+R, z denotes an output binary sequence, r denotes a redundant part, and y denotes first L bits of z such that:

$$z=[z_0,z_1,\ldots,z_{N-1}]=[y_0,y_1,\ldots,y_{L-1},r_0,r_1,\ldots,r_{R-1}].$$

Figure 5:
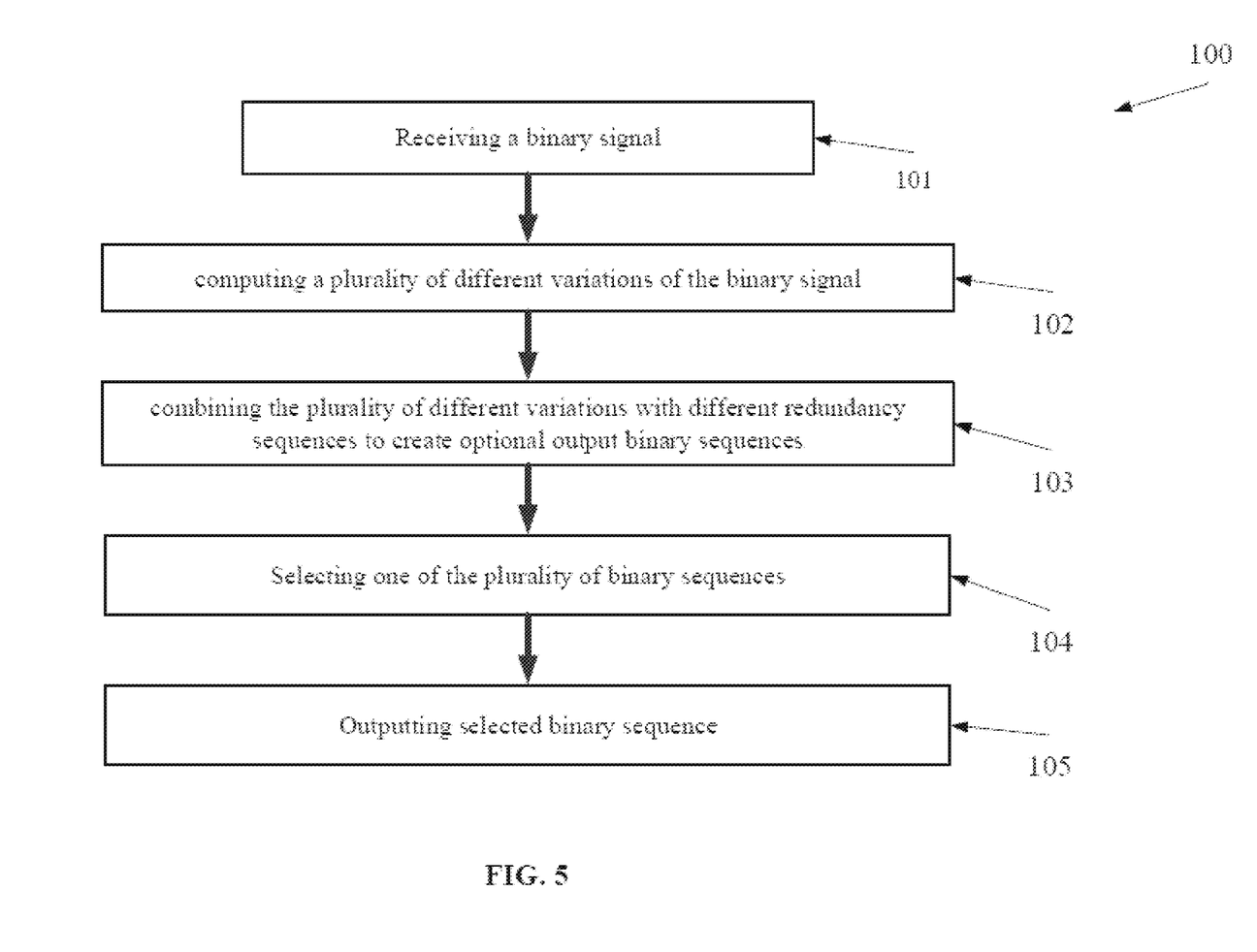
FIG. 5 is a schematic illustration of a process encoding a binary signal at a transmission side by computing different variations of the binary signal and combining them with different redundancy sequences to create optional output binary sequences which are selected according to binary digit prevalence, according to some embodiments of the present application.

First, as shown at 101, the binary signal, x, is received optionally via the input 201. The binary signal is optionally forwarded to the encoding processor 202. This allows, as shown at 102, computing a plurality of different variations of the binary signal. The different variations are optionally different binary sequences.

Now, as shown at 103, each one of the different variations is combined with a different redundancy sequence to create a plurality of optional output binary sequences. Optionally, the redundancy sequence is selected from different redundancy sequences which are defined in a dataset such as a LUT.

The different redundancy sequence is optionally a sequence of bits having a known length. The combination is optionally done using transformation functions denoted herein as T. The transformation functions are optionally selected so that the combinations, the optional output binary sequences, differ from one another as much as possible.

As shown at 104, one of the binary sequences is selected for transmission according to a binary digit prevalence analysis. The binary digit prevalence may be calculated according to at least one count of a selected digit in each of the plurality of different variations. For instance, the binary sequence with the lowest prevalence of 1 bits is selected. In another example, the binary sequence with the second lowest prevalence of 1 bits is selected.

As shown at 105, the selected binary sequence is outputted, for instance transmitted or forwarded to transmission, for instance via an optical path.

Optionally, the selected binary sequence is transmitted using a DCM for CD pre-compensation. Optionally, the selected binary sequence is transmitted via a DCF. Optionally, the selected binary sequence is transmitted using an IQ or dual-drive MZM for CD pre-compensation.

For example, reference is now made to a mathematical representation of the process 100. The different variations which are computed in 102, also referred to as candidates are denoted herein as $c^k$, may be generated by a modulo 2 operation, for instance such that:

$$c^k=[d_0^k,d_1^k,\ldots,d_{L-1}^k,r_0^k,r_1^k,\ldots,r_{R-1}^k]=d^k r^k$$

$$d^k=x\oplus T^k=[x_0\oplus T_0^k,x_1\oplus T_1^k,\ldots,x_{L-1}\oplus T_{L-1}^k],$$

where r denotes bit addition.

Optionally, the combination indicated with reference to 103 is done using transformation functions T. For example the first two transformation functions are optionally defined as follows:

$$T^0=[0,0,\ldots,0]$$

$$T^1=[1,1,\ldots,1]$$

The transformation functions require a redundant bit and the candidates are:

$$c^0=[x_0,x_1,\ldots,x_{L-1},0]$$

$$c^1=[\overline{x_0},\overline{x_1},\ldots,\overline{x_{L-1}},1]=[x_0^c,x_1^c,\ldots,x_{L-1}^c,1].$$

When the above transformation functions are applied on an exemplary input sequence 0001010, the two optional output binary sequences are 00010100 and 11101011. This allows the encoding processor 202 to select the optional output binary sequence 00010100 as it has less 1 bits.

In order to decrease probability of 1 bits, more optional output binary sequences that differ from one another as much as possible are computed. Optionally, a Hadamard matrix of L×L is used to compute different variations of the binary signal. Hadamard matrix may be such that L<428 and mod(L,4)=0 when all rows (and optionally columns) are orthogonal. For example when a Hadamard matrix with L=4 is:

$$H = \begin{bmatrix} 1 & 1 & 1 & 1 \\ 1 & -1 & 1 & -1 \\ 1 & 1 & -1 & -1 \\ 1 & -1 & -1 & 1 \end{bmatrix},$$

different variations of the binary signal are constructed form transformation matrix T wherein even rows 2k correspond to H k rows, −1 is replaced by 0 and T odd rows 2k−1 are inverted even rows 2k:

$$T = \begin{bmatrix} 0 & 0 & 0 & 0 \\ 1 & 1 & 1 & 1 \\ 0 & 1 & 0 & 1 \\ 1 & 0 & 1 & 0 \\ 0 & 0 & 1 & 1 \\ 1 & 1 & 0 & 0 \\ 0 & 1 & 1 & 0 \\ 1 & 0 & 0 & 1 \end{bmatrix} = [T_0, T_1, \ldots, T_{2L-1}]^T.$$

In such a matrix the number of redundant bits indicates how many T functions are used for generation of different variations of the binary signal and 2R functions are to be selected. For example, when the input word 1111 and R=2 the transformation matrix is defined as follow:

$$T^4 = \begin{bmatrix} 0 & 0 & 0 & 0 \\ 1 & 1 & 1 & 1 \\ 0 & 1 & 0 & 1 \\ 1 & 0 & 1 & 0 \end{bmatrix} = [T_0, T_1, T_2, T_3]^T,$$

and the optional output binary sequences are:

$$c = \begin{bmatrix} 1 & 1 & 1 & 1 & 0 & 0 \\ 0 & 0 & 0 & 0 & 0 & 1 \\ 1 & 0 & 1 & 0 & 1 & 0 \\ 0 & 1 & 0 & 1 & 1 & 1 \end{bmatrix} = [c_0, c_1, c_2, c_3]^T.$$

The number of 1 bits in rows is 4, 1, 3, and 4 so that the optional output binary sequence 000001 is selected as having the lowest prevalence of 2 bits. When received at a decoding side, the redundancy sequence is identified in the selected output binary sequence and used for selecting a transformation function for the decoded thereof, for example the last two bits of the selected output binary sequence define the transformation. It is assumed that the selected output binary sequence is received without errors.

Optionally, the selection of an optional output binary sequence takes into account the number of transitions in the binary sequence. A transition occurs when a bit of one type having a neighboring bit of a different type in the sequence (e.g. 0 bit neighboring a 1 bit and 1 bit neighboring a 0 bit). This allows selecting sequences with fewer transitions in order to break long error bursts. In such embodiments, an optional output binary sequence having the lowest number of transitions is selected from all the optional output binary sequences with the lowest number of 1 bits. For instance when the input sequence is 1010 and the optional output binary sequences are:

$$c = \begin{bmatrix} 1 & 0 & 1 & 0 & 0 & 0 \\ 0 & 1 & 0 & 1 & 0 & 1 \\ 1 & 1 & 1 & 1 & 1 & 0 \\ 0 & 0 & 0 & 0 & 1 & 1 \end{bmatrix} = [c_0, c_1, c_2, c_3]^T,$$

where the number of 1 bits in rows 1 and 4 is 2. The number of transitions is equal to the number of positions where symbols changes. Thus, the number of transitions in row 1 is 3 and the number of transitions in row 4 is 1. Therefore, row 4 is selected to be the sequence to output. The sequence in row 4 is likely less prone to errors.

According to some embodiments of the present disclosure, the optional output binary sequence, which is selected for output, is selected based on the number of transitions and not on the prevalence of 1 bits. This can be used in applications where the probability of 1 bits is not important and the number of transitions plays an important role, for example used in systems where MLSE compensates for ISI caused by residual CD and/or bandwidth limitations.

A larger redundancy enables lower probability of 1 bits. See for example FIG. 7 which depicts a graph correlating between probability of 1 bits and a number of redundant bits (R) for L=32. For example, when L=32 and R=2 the redundancy is 2/32 and this enables p(1)~0.4.

Optionally, when a very specific value of p(1) is desired, for instance combined and used in coherent systems to optimize complex symbol probabilities, it can be achieved by an additional circuit that estimates the current value of p(1).

Figure 7:
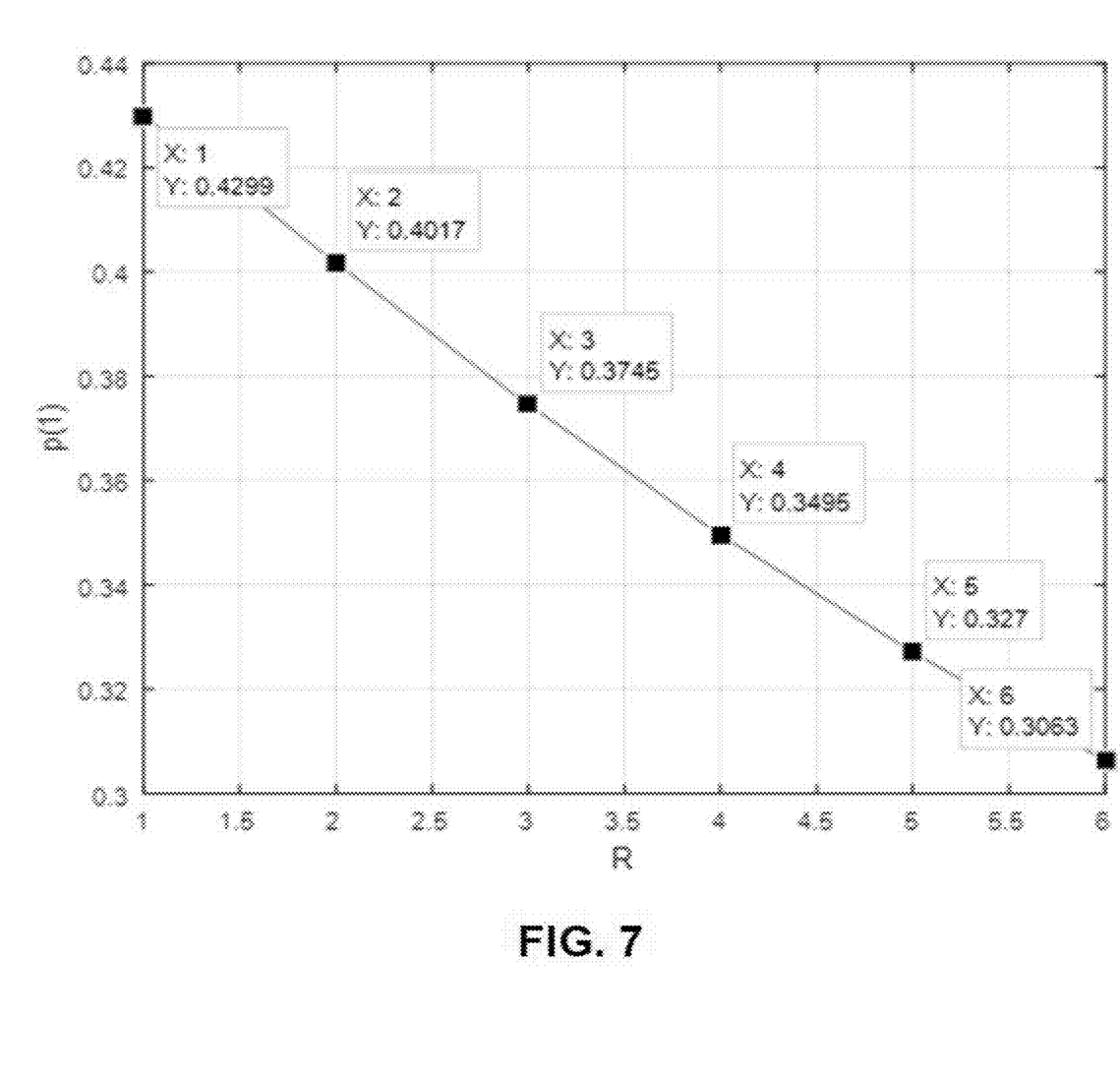
FIG. 7 is a graph correlating between probability of 1 bits and a number of redundant bits for L=32 according to some embodiments of the present application.
Figure 8:
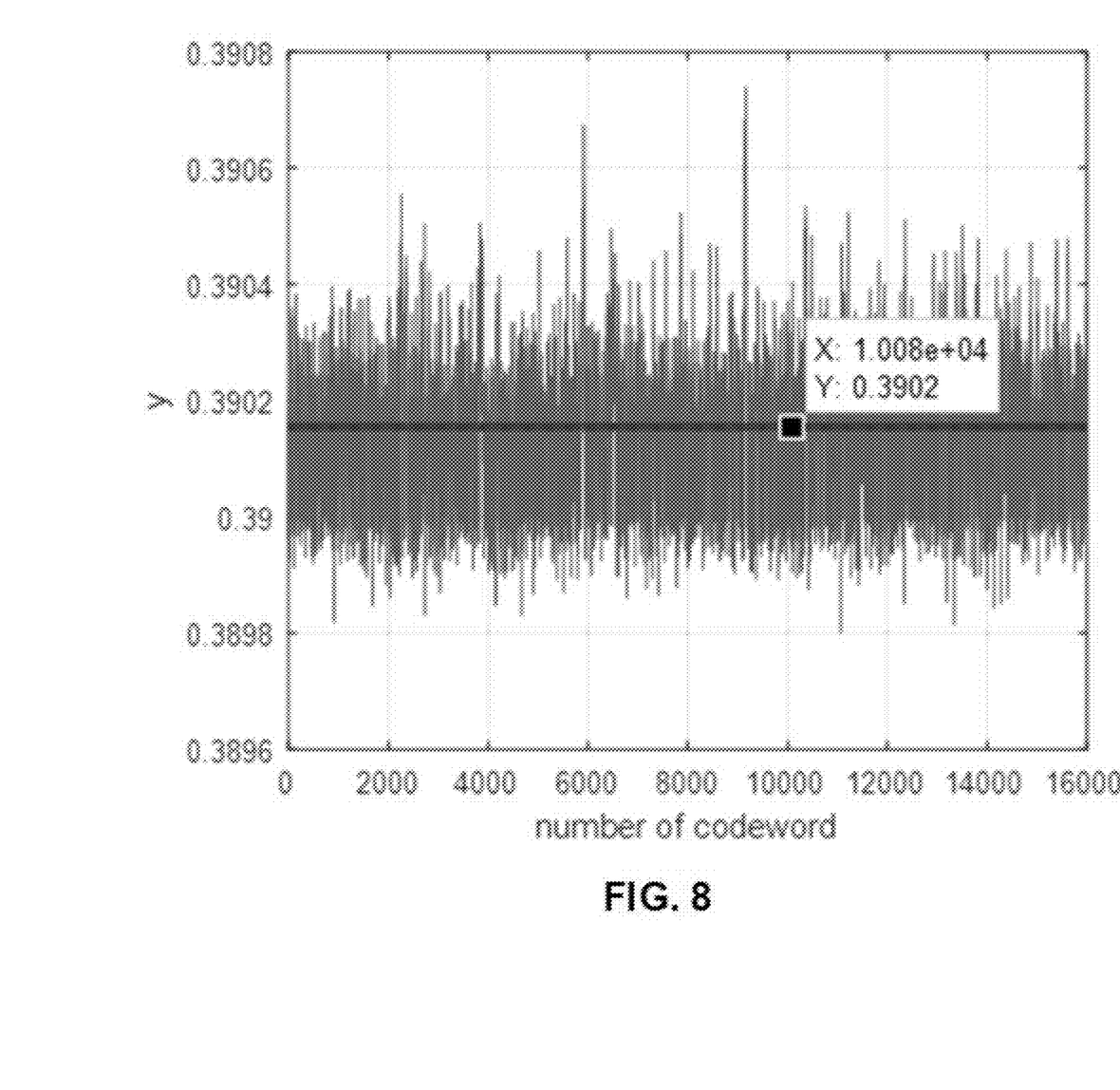
FIG. 8 is a graph depicting the probability of 1 for R=3 and L=32 and the target p(1)=0.39.

For example, when L=32 at least R=3 is required to achieve a target probability such as p(1)=0.39; see for example FIG. 7. The number of 1 bits in encoded sequence is averaged by a low-pass filter. This helps the encoding processor to select the best sequence of the plurality of different variations. In such embodiments the selected binary sequence may be a binary sequence having the highest averaged count or the lowest averaged count. The low-pass filter may be realized in the IIR structure (first-order low-pass filter) for instance y(n+1)=(1−m)*y(n)+m*mean(z), where z is an encoded sequence of length L+R=35. The selection is optionally done based on the following rule where when y(n)<p(1) the sequence with the highest number of 1 bits is selected and when y(n)≥p(1) the sequence with the lowest number of 1 bits is selected. In such embodiments, the results for m=0.001 (shown in FIG. 8) indicate that the averaged (maintained) power is 0.3902. Power oscillations for m=0.001 are within 0.3898 and 0.3908 that is directly related to the parameter m.

Figure 9:
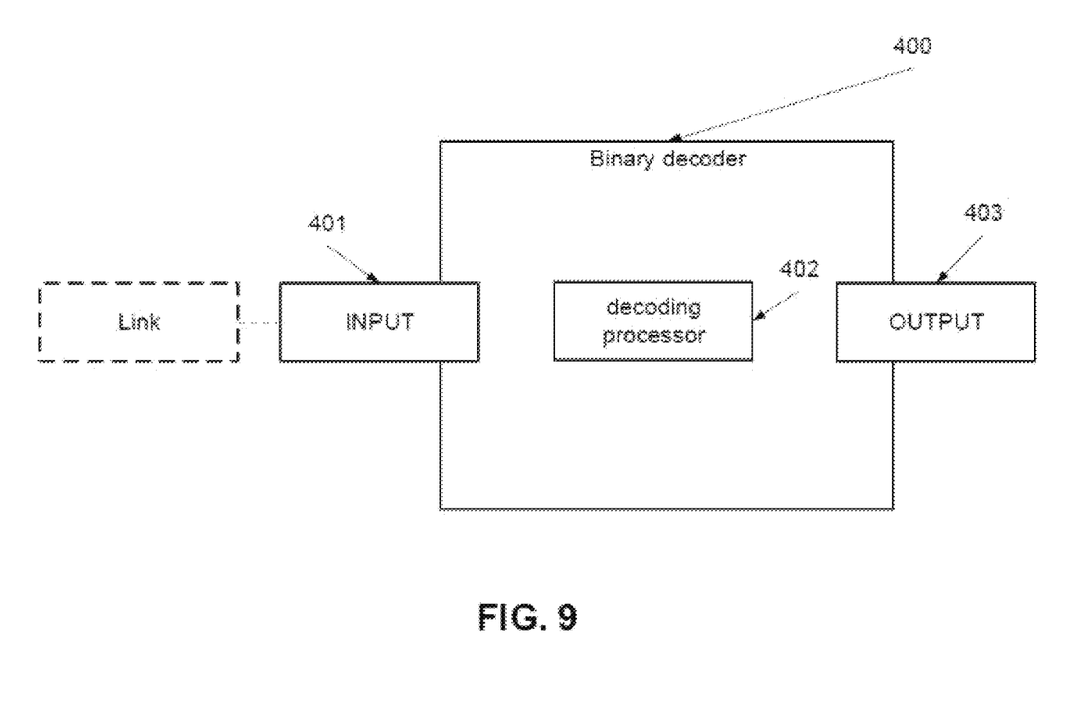
FIG. 9 is a schematic illustration of a BD according to some embodiments of the present disclosure.

Reference is now made to FIG. 9 which is a schematic illustration of a BD 400 (designated as binary decoder 400) adapted to decode a binary signal, a sequence which is encoded as described above, for example with reference to FIG. 5, according to some embodiments of the present disclosure. The BD 400 includes an input 401 adapted to receive a binary signal having a redundancy sequence is indicative of which variation of an origin binary signal was selected and encoded in the received binary signal. The BD 400 further includes a decoding processor 402 that computes an origin binary signal by converting the binary signal according to the variation indicated by the redundancy sequence and removing the redundancy sequence. The BD 400 further includes an output 403 that outputs the selected binary sequence for instance to a receiver component.

Figure 10:
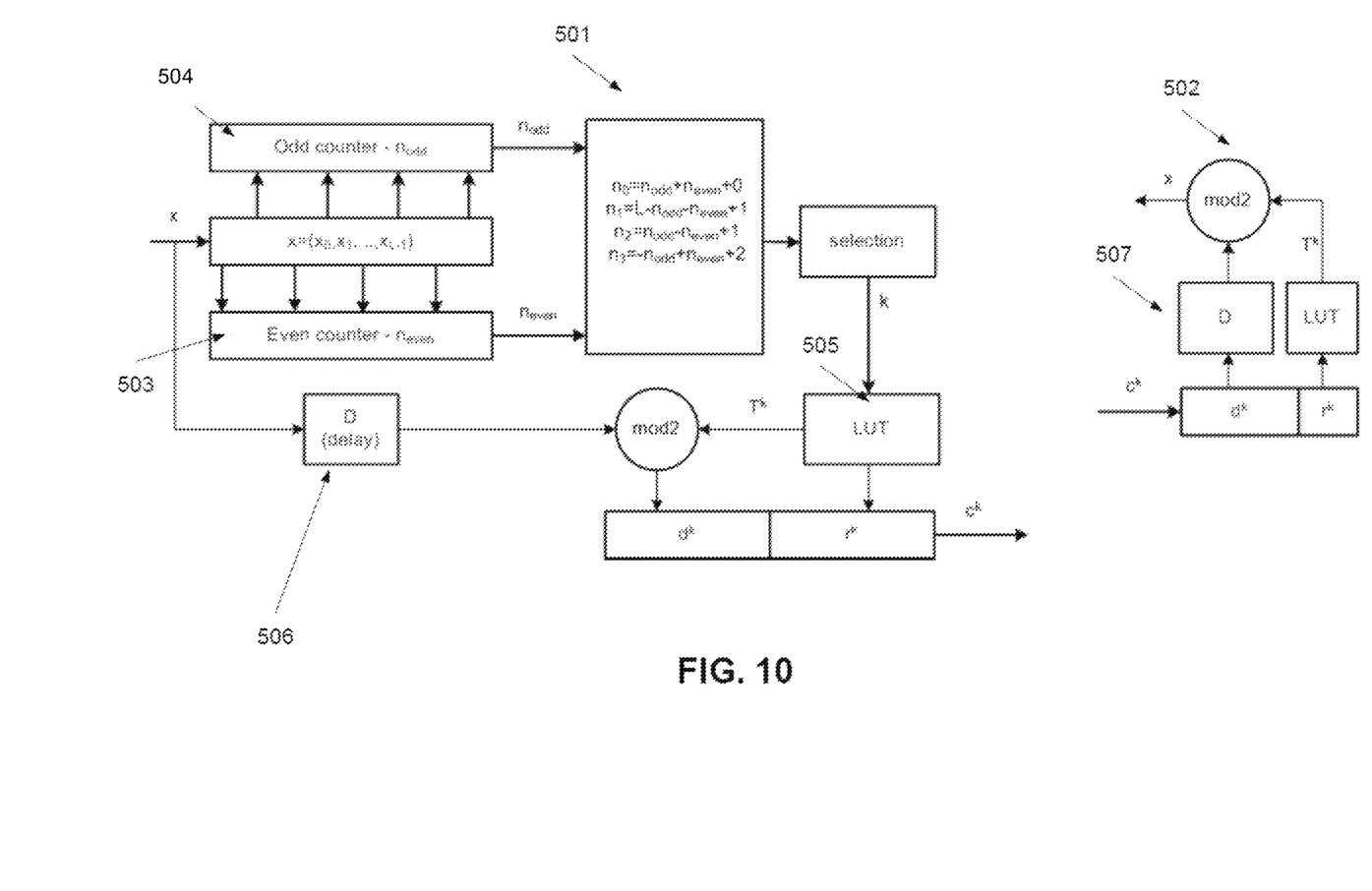
FIG. 10 is a block chart of an exemplary BE and BD for two redundant bits according to some embodiments of the present disclosure.

FIG. 10 is a more detailed block chart of an exemplary BE 501 and BD 502 for R=2, according to some embodiments of the present disclosure. In this example, four optional output binary sequences are generated at the BE 501 using first two rows of an exemplary Hadamard matrix. Two counters 503, 504 count number of 1 bits at odd and even positions. Using this information and redundant bits the number of 1 bits for each optional output binary sequence is derived. After the optional output binary sequence is selected the input sequence is encoded using $T^k$ and $r^k$ from a LUT 505. At the BD 502, the redundant part is identified and used for directly selecting a decoding function $T^k$.

Optionally, encoding and decoding delays 506, 507 are taken into account when decoding the binary sequence.

In an exemplary implantation, a BE and a BD designed as described above are used in a mash optical network with ability to compensate for CD. Optionally, the BD is integrated in a DD receiver, for example when the transmitter uses DCM for CD pre-compensation and/or when links with DCFs are used and/or when the transmitter uses IQ or dual-drive MZM for CD pre-compensation ($CD^{-1}$) and/or when links with coherent receiver (CR) are used.

Optionally, the BE is integrated in a transmitter to change the prevalence of 1 bits. After FEC encoding and digital pre-processing (e.g. $CD^{-1}$ or other), data is modulated and transmitted. The received data is processed in CDR that extracts clock information and equalizes the received data. Equalization may include feed-forward, an MLSE and/or the like. Then, the equalized data are FEC decoded and later binary decoded as described above.

Figure 11:
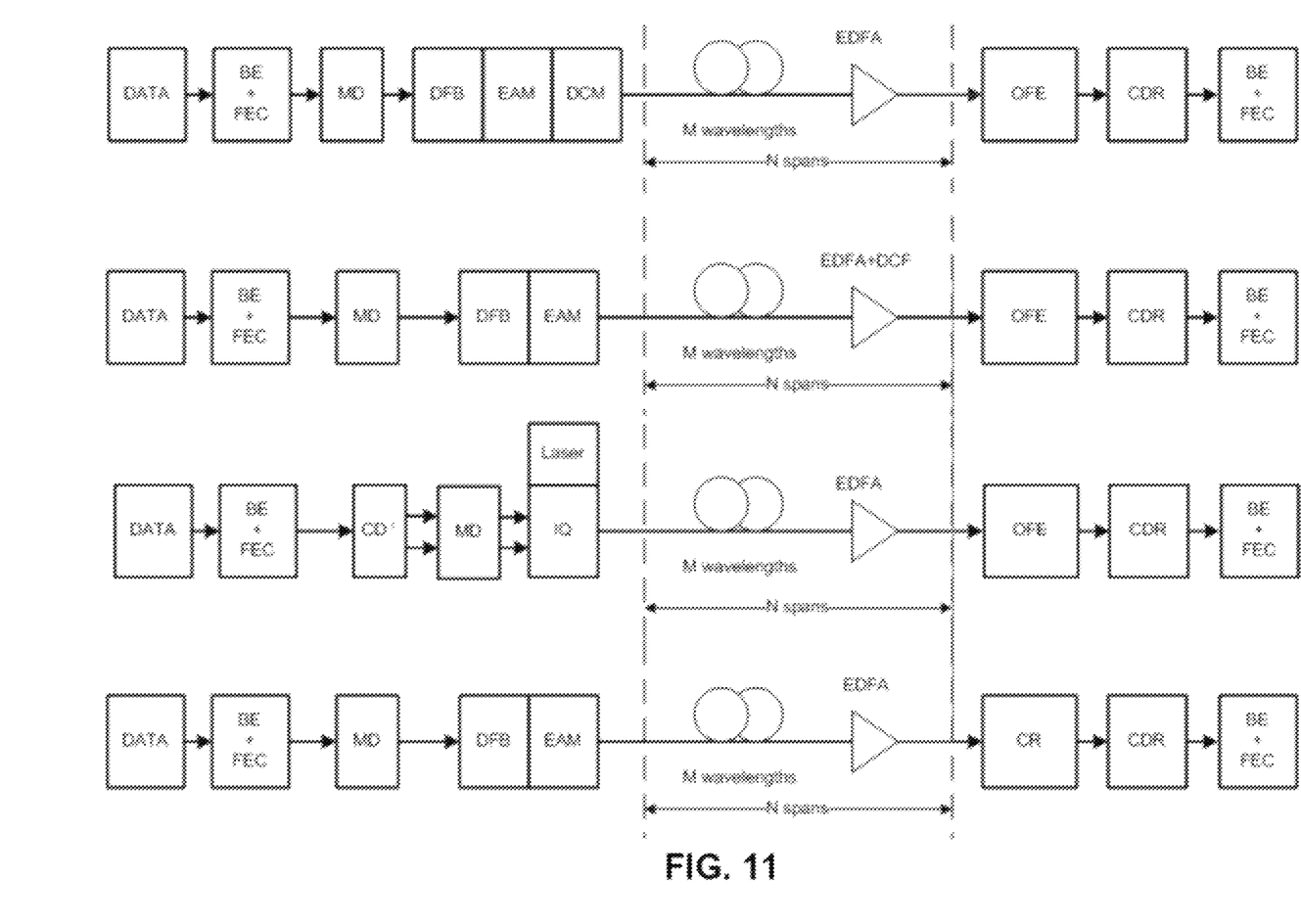
FIG. 11 are application scenarios and DSP architectures using a BE as described herein according to some embodiments of the present disclosure.

Exemplary DSP architectures using the BE as described herein are depicted in FIG. 11.

The methods and systems may be used in the process of encoding systematic binary codes. As indicated above, the described BE may be used for changing the prevalence of 1 bits. After FEC encoding the probability of 1 bits in the parity bits section is 0.5. In an optical network with hundreds of kilometers of fibers, hard-decision binary code with about 7% redundancy are mostly used. The best codes in this class work with about 4e-3 pre-FEC BER. The gain in using the BE described herein block will be decreased in the FEC parity sections as in this part $p(1)=p(0)$. BE encodes bits and $p(1)=p1$ is controlled. This sequence is encoded by a systematic code that keeps the original bit sequence and adds the parity bits with $p(1)=p2=0.5$. The total $p(1)=(p1*k+p2*r)/(k+r)$ where k is the number of bits after BE and r is the number of parity bits added by FEC.

Figure 12:
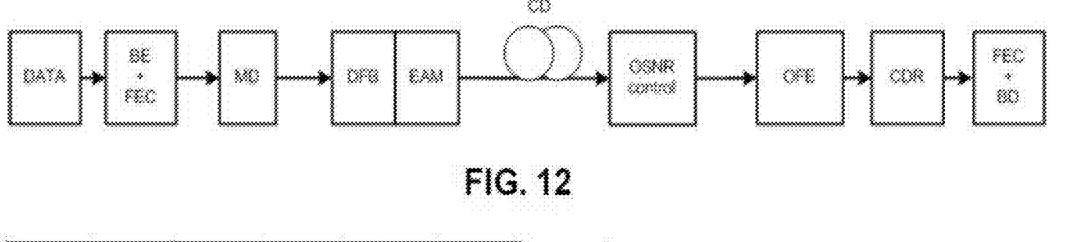
FIG. 12 is an exemplary transmission scenario and DSP architecture that uses a BE as described herein according to some embodiments of the present disclosure for simulation.
Figure 13A:
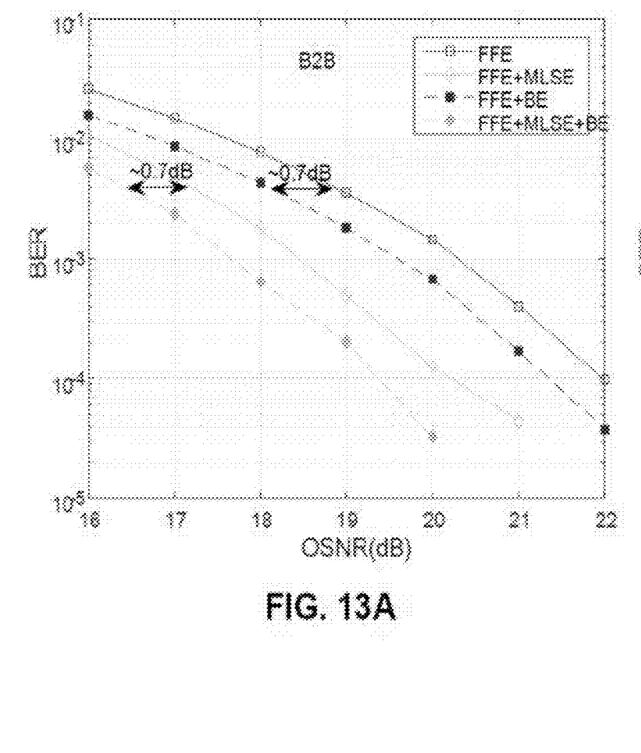
FIGS. 13A and 13B are graphs depicting an outcome of the simulation made using the exemplary DSP architecture depicted in FIG. 12.
Figure 13B:
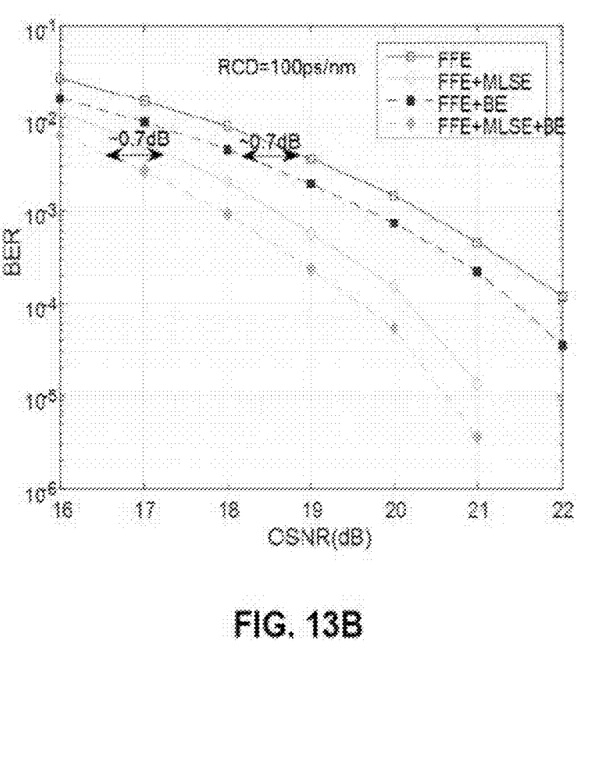

Reference is now made to a simulation of encoding binary sequences in a DSP using the BE and BD defined as depicted in FIG. 12, according to some embodiments of the present application. In this simulation the input power is set to 0 decibel-milliwatts (dBm) and an optical signal-to-noise ratio (OSNR) and CD are varied to estimate performance with and without the binary encoding. A binary data with 7% FEC is sent at a rate of 28 Gb/s and a BE defined as described above with L=32 and R=2 is used. When the BE is active the line rate is increased by 17/16. The transmitter and the receiver bandwidths are set to be 10 gigahertz (GHz). A chirp-free modulator extinction ratio is 11.5 decibel (dB) and a linear feed-forward equalizers (FFE) with 21 taps and 2-state MLSE are used for equalization. As depicted in the graphs of FIGS. 13A-13B, in a back-to back (B2B) case, a gain of ~0.7 dB is achieved using a BE as described above in both cases with and without MLSE. The same gain is observed in links with 100 picoseconds (ps)/nm residual CD (RCD).

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

It is expected that during the life of a patent maturing from this application many relevant methods and systems will be developed and the scope of the term processor, a receiver, and a transmitter is intended to include all such new technologies a priori.

As used herein the term "about" refers to ±10%.

The terms "comprises", "comprising", "includes", "including", "having" and their conjugates mean "including but not limited to". This term encompasses the terms "consisting of" and "consisting essentially of".

The phrase "consisting essentially of" means that the composition or method may include additional ingredients and/or steps, but only if the additional ingredients and/or steps do not materially alter the basic and novel characteristics of the claimed composition or method.

As used herein, the singular form "a", "an" and "the" include plural references unless the context clearly dictates otherwise. For example, the term "a compound" or "at least one compound" may include a plurality of compounds, including mixtures thereof.

The word "exemplary" is used herein to mean "serving as an example, instance or illustration". Any embodiment described as "exemplary" is not necessarily to be construed as preferred or advantageous over other embodiments and/or to exclude the incorporation of features from other embodiments.

The word "optionally" is used herein to mean "is provided in some embodiments and not provided in other embodiments". Any particular embodiment of the disclosure may include a plurality of "optional" features unless such features conflict.

Throughout this application, various embodiments of this disclosure may be presented in a range format. It should be understood that the description in range format is merely for convenience and brevity and should not be construed as an inflexible limitation on the scope of the disclosure. Accordingly, the description of a range should be considered to have further disclosed all the possible subranges as well as individual numerical values within that range. For example, description of a range such as from 1 to 6 should be considered to have further disclosed subranges such as from 1 to 3, from 1 to 4, from 1 to 5, from 2 to 4, from 2 to 6, from 3 to 6 etc., as well as individual numbers within that range, for example, 1, 2, 3, 4, 5, and 6. This applies regardless of the breadth of the range.

Whenever a numerical range is indicated herein, it is meant to include any cited numeral (fractional or integral) within the indicated range. The phrases "ranging/ranges between" a first indicate number and a second indicate number and "ranging/ranges from" a first indicate number "to" a second indicate number are used herein interchangeably and are meant to include the first and second indicated numbers and all the fractional and integral numerals therebetween.

It is appreciated that certain features of the application, which are, for clarity, described in the context of separate embodiments, may also be provided in combination in a single embodiment. Conversely, various features of the application, which are, for brevity, described in the context of a single embodiment, may also be provided separately or in any suitable subcombination or as suitable in any other described embodiment of the disclosure. Certain features described in the context of various embodiments are not to be considered essential features of those embodiments, unless the embodiment is inoperative without those elements.

All publications, patents and patent applications mentioned in this specification are herein incorporated in their entirety by reference into the specification, to the same extent as if each individual publication, patent or patent application was individually indicated to be incorporated herein by reference. In addition, citation or identification of any reference in this application shall not be construed as an admission that such reference is available as other approaches to the present application. To the extent that section headings are used, they should not be construed as necessarily limiting.

What is claimed is:

1. A binary encoder comprising:
an input configured to receive a binary signal;
an encoding processor coupled to the input and configured to:
compute a plurality of variations of the binary signal;
obtain a plurality of redundancy sequences;
combine each of the variations with a different redundancy sequence from the redundancy sequences to create a plurality of optional output binary sequences cooresponding to the variations of the binary signal; and
select one of the optional output binary sequences according to a binary digit prevalence to obtain a selected binary sequence; and
an output coupled to the encoding processor and configured to output the selected binary sequence.

2. The binary encoder of claim 1, wherein the encoding processor is further configured to select one of the optional output binary sequences according to a number of digit transitions.

3. The binary encoder of claim 1, wherein the encoding processor is further configured to combine each of the variations using a modulo 2 operation.

4. The binary encoder of claim 1, wherein the encoding processor is further configured to calculate the variations using a plurality of binary transformation functions.

5. The binary encoder of claim 1, wherein the encoding processor is further configured to select the different redundancy sequence from a plurality of redundancy sequences defined in a lookup table (LUT).

6. The binary encoder of claim 1, wherein the encoding processor is further configured to calculate the binary digit prevalence according to a count of a selected digit in each of the variations.

7. The binary encoder of claim 6, wherein the encoding processor is further configured to:
average the count of the selected digit in each of the variations using a low-pass filter; and
select one of the optional output binary sequences as a binary sequence having a highest averaged count.

8. The binary encoder of claim 6, wherein the encoding processor is further configured to:
average the count of the selected digit in each of the variations of the binary signal using a low-pass filter; and
select one of the optional output binary sequences as a binary sequence having a lowest averaged count.

9. The binary encoder of claim 1, wherein the encoding processor is further configured to calculate the variations using a Hadamard matrix.

10. The binary encoder of claim 1, wherein the encoding processor is further configured to transmit the selected binary sequence via an optical cable using a dispersion compensation module (DCM) for chromatic dispersion (CD) pre-compensation.

11. The binary encoder of claim 1, wherein the encoding processor is further configured to transmit the selected binary sequence using an optical fiber.

12. The binary encoder of claim 1, wherein the encoding processor is further configured to modulate the selected binary sequence using an in-phase and quadrature (IQ) modulator that is capable of compensating for chromatic dispersion (CD).

13. The binary encoder of claim 1, wherein the encoding processor is further configured to modulate the selected binary sequence using a dual-drive Mach-Zehnder modulator that is capable of compensating for chromatic dispersion (CD).

14. A method of encoding a binary sequence, the method comprising:
receiving a binary signal;
computing a plurality of variations of the binary signal;
obtaining a plurality of different redundancy sequences;
combining each of the variations with a different redundancy sequence from the redundancy sequences to create a plurality of optional output binary sequences corresponding to the variations of the binary signal;
selecting one of the optional output binary sequences according to a binary digit prevalence to obtain a selected binary sequence; and
outputting the selected binary sequence.

15. The method of claim 14, further comprising selecting one of the optional output binary sequences according to a number of digit transitions.

16. The method of claim 14, further comprising combining each one of the variations of the binary signal using a modulo 2 operation.

17. The method of claim 14, further comprising calculating the variations of the binary signal using a plurality of binary transformation functions.

18. The method of claim 14, further comprising selecting the different redundancy sequence from a plurality of redundancy sequences defined in a lookup table (LUT).

19. The method of claim 14, further comprising calculating the binary digit prevalence according to a count of a selected digit in each of the variations of the binary signal.

20. A binary decoder comprising:
an input configured to receive a binary signal;
a decoding processor coupled to the input and configured to:
identify a redundancy sequence in the binary signal;
select a transformation function according to the redundancy sequence;
convert the binary signal according to the transformation function; and
remove the redundancy sequence from the binary signal to compute an original binary signal; and
an output coupled to the decoding processor and configured to output the original binary signal.

* * * * *